United States Patent [19]
Park

[11] Patent Number: 5,698,882
[45] Date of Patent: Dec. 16, 1997

[54] LDD POLYSILICON THIN-FILM TRANSISTOR

[75] Inventor: Yong-hae Park, Kyungki-do, Rep. of Korea

[73] Assignee: Samsung Electronics Co., Ltd., Suwon, Rep. of Korea

[21] Appl. No.: 363,199

[22] Filed: Dec. 27, 1994

[30] Foreign Application Priority Data

Dec. 28, 1993 [KR] Rep. of Korea ............ 1993-30230

[51] Int. Cl.[6] ............ H01L 29/04; H01L 29/76; H01L 29/94; H01L 27/01
[52] U.S. Cl. ............ 257/344; 257/59; 257/66; 257/347; 257/349; 257/352; 437/43; 437/46
[58] Field of Search ............ 257/347, 344, 257/352, 349, 66, 59; 437/43, 46

[56] References Cited

U.S. PATENT DOCUMENTS

| | | | |
|---|---|---|---|
| 5,001,539 | 3/1991 | Inoue et al. | 257/66 |
| 5,116,768 | 5/1992 | Kawamura | 437/21 |
| 5,163,180 | 11/1992 | Eltoukhy et al. | 257/530 |
| 5,382,533 | 1/1995 | Ahmad et al. | 437/24 |
| 5,412,493 | 5/1995 | Kunii et al. | 257/344 |
| 5,466,958 | 11/1995 | Kakumu | 257/344 |
| 5,567,966 | 10/1996 | Hwang | 257/347 |

*Primary Examiner*—Valencia Martin Wallace
*Attorney, Agent, or Firm*—Samsung Electronics Co., Ltd.

[57] ABSTRACT

In an LDD polysilicon thin-film transistor, the active layer is formed in a single body and the upper surface thereof is oxidized. A gate insulating layer has a bird's beak type structure and the source and drain region are simultaneously formed in high and low concentrations by performing one ion implantation process, so that the manufacturing process is simplified and the quality of the active layer is improved. Also, the ion concentration level tapers off toward the channel, so that the $V_{gs}$–$I_{ds}$ characteristic is improved.

9 Claims, 5 Drawing Sheets

LDD POLYSILICON THIN-FILM TRANSISTOR

BACKGROUND OF THE INVENTION

The present invention relates to a device for driving a flat-panel liquid crystal display, and more particularly, to a lightly doped drain (LDD) polysilicon thin-film transistor and manufacturing method thereof using a high temperature process.

Thin-film transistors (TFTs) include amorphous-silicon thin-film transistors and polysilicon thin-film transistors. Among these, FIG. 1 is a section view of a conventional polysilicon thin-film transistor which can be applied as a pixel switching device of a flat-panel liquid crystal display such as an image display device (monitor) for television or computer. Here, reference numerals 201, 202, 203, 204, 205, 206, 207 and 208 represent a quartz substrate, a source, an active layer, a drain, a gate insulating layer, a gate, an inter-insulating layer (oxide layer) and an aluminum electrode, respectively. Here, a polysilicon thin-film transistor in which the carrier mobility is extensive is used for realizing higher resolution over a larger display area and requires a leakage current value of about 0.1 pA in order to maintain liquid crystal pixel display for a required duration.

Since the polysilicon thin-film transistor, differently from a monosilicon MOSFET, has a junction characteristic in which an active layer has a resistance, a special structure or fabricating process is required to control the leakage current value to the aforementioned level of about 0.1 pA. In order to reduce leakage current, various research efforts have been made into changing device structure, such as an LDD or off-set structure, and reducing the thickness of the active layer.

However, if the thickness of the active layer is reduced to a simple form as shown in FIG. 1, the aluminum used as source and drain electrodes diffuses into the active layer, thereby damaging the device and deteriorating its characteristics. Thus, the polysilicon thin-film transistor as shown in FIG. 2 has been developed, and transistor performance is improved by adopting a self-aligned structure for decreasing an undesirable stray capacitance between layers.

However, as liquid crystal devices gradually improve, a transistor having even better performance is required. Accordingly, the LDD structure is adapted in the polysilicon thin-film transistor of FIG. 2.

Referring to FIG. 2, showing a conventional polysilicon thin-film transistor having improved performance, a source 302 and a drain 304 are formed on the upper surface of a quartz substrate 301 and a thin active layer 303 as a channel for conducting electricity is formed therebetween. A weakly doped region 313 for reducing leakage current is provided on either side of the active layer. Also, a gate insulating layer 305 formed thereon electrically insulates a gate 306 and active layer 303. An inter-insulating layer 307 for insulating interlayers is formed on the upper sides of the gate 306 and gate insulating layer 305. An aluminum electrode 308 penetrating two insulating layers 305 and 307 is formed above source 302, drain 304 and gate 306. Here, reference numerals 300 and 308 are an oxide layer and an aluminum electrode, respectively.

A method for manufacturing the LDD polysilicon thin-film transistor having the above structure is as follows.

First, as shown in FIG. 3, after a sensitive layer (photoresist) 414 is coated on gate 406 and patterned, an ion source 415 ($PE_3$ or B) of high concentration is implanted. Here, reference numerals 400, 401, 402, 403, 404 and 405 represent an oxide layer, a substrate, a source, a channel, a drain and a gate insulating layer, respectively.

Thereafter, as shown in FIG. 4, the sensitive layer is removed and a second ion implantation process is performed using an ion source 416 ($PE_3$ or B) of a low concentration, thereby completing an LDD polysilicon thin-film transistor.

As described above, as the conventional LDD polysilicon thin-film transistor separately forms a channel for the active layer, a source and a drain, and requires two ion implantation processes, an excessive number of fabrication process are required. For example, at least two additional processes (photo-etching and removing the sensitive layer) are necessary to perform each ion implantation operation. Also, the low concentration ion implantation region (LDD structure), formed for improving the leakage current characteristic, also decreases the threshold current, which is undesirable.

SUMMARY OF THE INVENTION

To solve the above problem, it is an object of the present invention to provide an LDD polysilicon thin-film transistor and a manufacturing method therefor, in which the structure of an active layer is simple and additional processing is not required.

To achieve the above object, the polysilicon thin-film transistor according to the present invention comprises: a quartz substrate; an active layer formed on the quartz substrate and composed of drain and source regions formed by implanting a high ion concentration into both edges of the active layer, two low concentration ion implantation regions adjacent to the source and drain, and a channel formed between the low concentration ion implantation regions; a gate insulating layer formed on the upper surface of the active layer; a gate formed on the gate insulating layer; an inter-insulating layer for insulating between each inter-layer and between devices; and an electrode penetrating inter-insulating layer for conducting between the source, gate and drain, and external terminals, respectively.

The method for manufacturing the LDD polysilicon thin-film transistor having the above structure comprises the steps of: (a) forming an oxide layer on a quartz substrate, coating a polysilicon film thereon and etching to form a transistor, thereby forming an active layer; (b) coating silicon nitride on the active layer and selectively etching to form a gate, thereby forming a silicon nitride film; (c) thermal-oxidizing a predetermined portion of the active layer exposed by the step (b), thereby forming an oxide layer for gate insulation; (d) removing the silicon nitride formed in the step (c), forming a polysilicon film on the whole substrate and etching to form a gate; (e) implanting a dopant into the active layer and the gate layer, thereby forming a high concentration region on the gate layer and forming high and low concentration regions on the active layer at the same time; (f) activating the dopant implanted in the ion implantation step by thermal-processing; and (g) forming an oxide layer for inter-insulation on the transistor obtained through the step (f), etching a window for contact with an electrode, vacuum-evaporating a metal thereon, and then etching again to form the electrode.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 5:
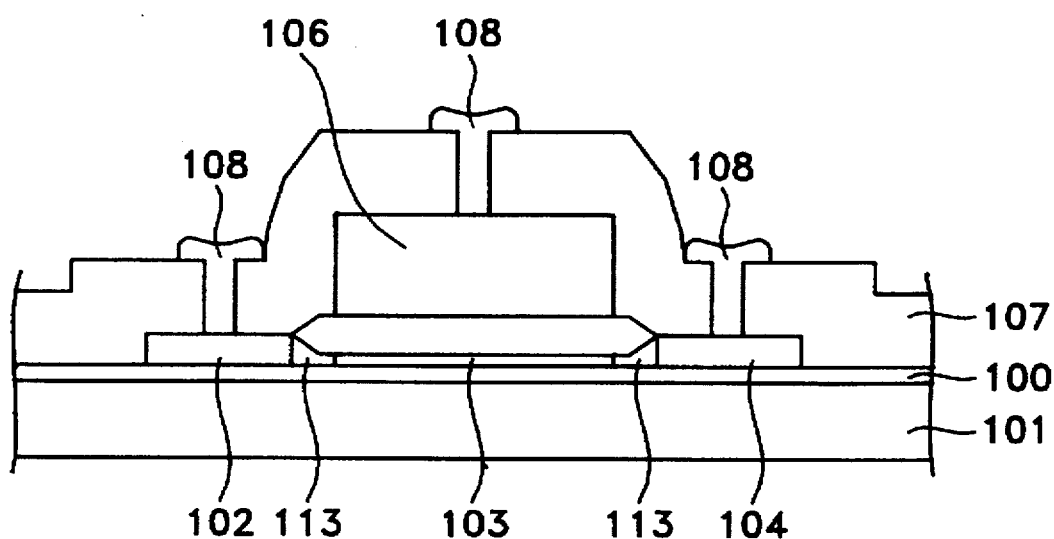
FIG. 5 is a section view of a polysilicon thin-film transistor according to the present invention.

Referring to FIG. 5, the structure of an LDD polysilicon thin-film transistor according to the present invention is as follows.

An oxide layer 100 is formed on the upper surface of a quartz substrate 101 so as to form device and active layers 102, 113, 103 and 104 formed on the upper surface of the oxide layer. The active layers are composed of source 102 and drain 104 regions to which high concentration ions (dopant) are implanted, a region 113 to which low concentration ions are implanted, and a channel 103 between low concentration regions 113, to which low concentration ion are not implanted. Region 113 which is weakly doped on either side of the active layer is for reducing the leakage current. A gate insulating layer 505 having a bird's beak structure in order to more easily form the low concentration region during ion implantation is formed on the upper surface of active layers for electrically insulating a gate 106 from the active layers.

Also, an inter-insulating layer 107 for insulating interlayer is formed atop gate 106, gate insulating layer 105, source 102 and drain 104. An aluminum electrode 108 is formed on source 102, drain 104 and gate 106 via the window of inter-insulating layer 107.

Meanwhile, the method for manufacturing an LDD polysilicon thin-film transistor having the above structure is as follows.

Figure 6:
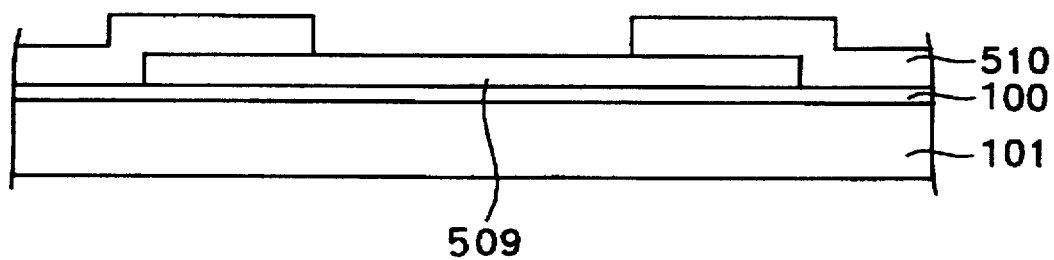
FIGS. 6–9 are section views showing the processing steps of the polysilicon thin-film transistor shown in FIG. 5.

As shown in FIG. 6, an oxide layer 100 is formed to a thickness of 5000 Å on the upper surface of quartz substrate 101 and polysilicon film of 800 Å in thickness is formed thereon. Then, an active layer 509 is formed by an etching process. Next, a silicon nitride film 510 of 1000 Å in thickness is formed by a vacuum-evaporation technique over the whole substrate and a spacer for forming a gate insulating layer 505 is formed by selectively etching silicon nitride film 510.

Figure 7:
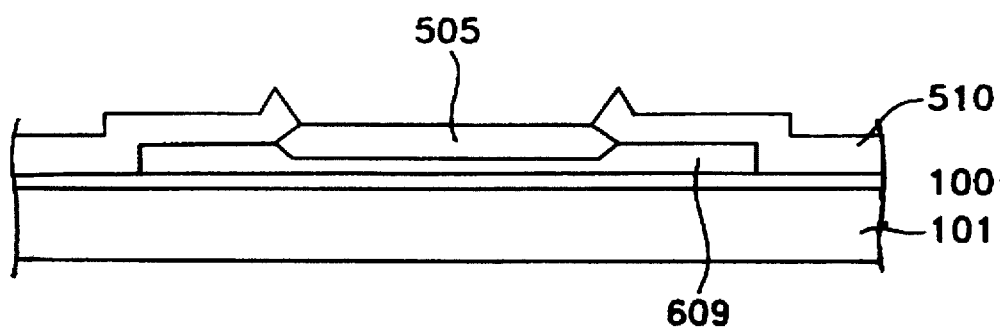

FIG. 7 shows an oxidation step where the upper surface of active layer exposed by the above etching process is thermal-oxidized at 1000° C. for forming oxide layer 505 for insulating the gate. The thermally oxidized layer 505 is selectively formed such that the portions on which the silicon nitride (510 in FIG. 6) is formed are not covered and the thermally oxidized layer reduces the thickness of the active layer since the thermally oxidized layer 505 grows in response with the polysilicon of active layer 609. As a result, the thermally oxidized layer 505 is formed for the channel portion of the active layer 609 to have a thickness of about 250 Å. The gate oxide layer 505 formed through the above process covers only the upper surface of channel region and the LDD region on both edges of gate insulating layer 505 have a bird's beak structure due to the influence of the silicon nitride layer.

Figure 8:
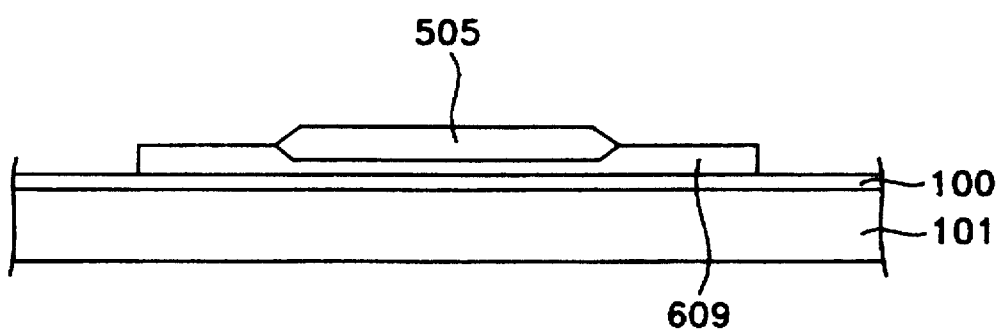
Figure 9:
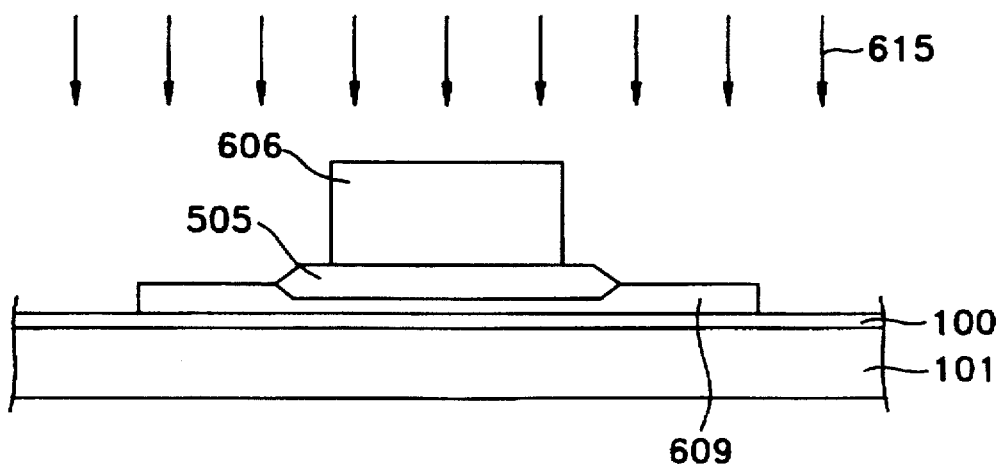

As shown in FIG. 8, the silicon nitride layer is removed and polysilicon film of 3000 Å in thickness is formed. Thereafter, etching is performed to form a gate 606 as shown in FIG. 9. Finally, the basic structure of a transistor composed of the simplified active layer is completed.

As shown in FIG. 9, an ion implantation process for implanting a dopant into active layer 609 and gate 606 is performed. Here, the channel region is maintained as a neutral state (without ion implantation) by the gate of polysilicon. A fairly low ion concentration 615 is implanted into the LDD region by the oxide layer grown in the shape of a bird's beak so as to provide a low concentration region on the active layer, thereby manufacturing the LDD transistor. A high concentration of ions are implanted into a portion without the oxide layer, thereby forming a source and drain region. Here, the high ion concentration is implanted to provide a good junction characteristic between the aluminum as the electrode material and the polysilicon as the active layer.

Figure 4:
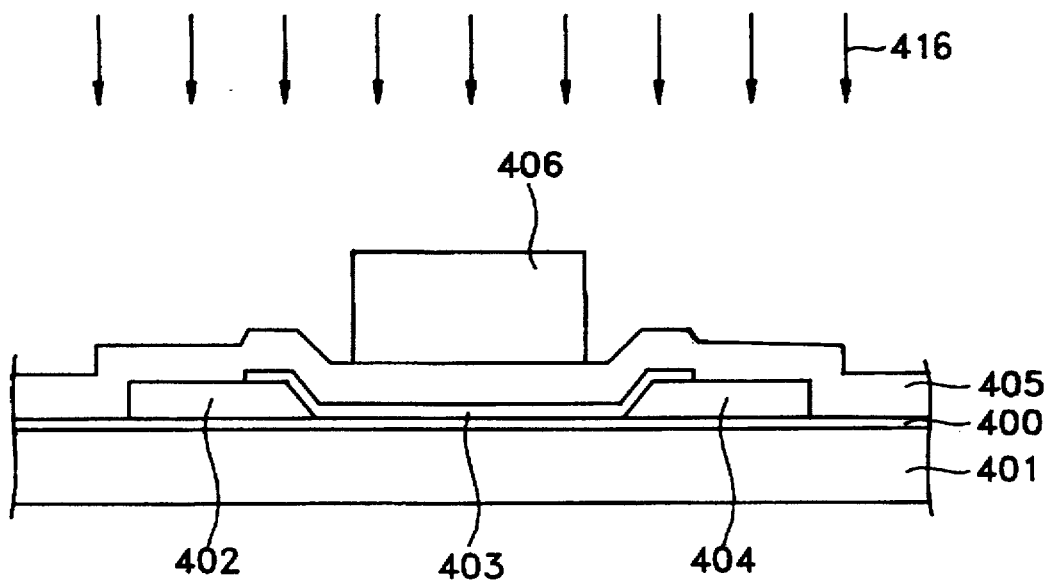

According to the conventional method, as described referring to FIG. 4, the first ion implantation process (high concentration ion source) is performed after photo-etching processing. Next, the sensitive layer is removed and then the second ion implantation process (low concentration ion source) is performed, so that an LDD polysilicon thin-film transistor is formed. However, according to the present invention, the high and low concentration regions are formed at the same time, through one ion implantation process in which a high concentration ion source ($PH_3$ or B) is used.

Thereafter, thermal-processing for activating the implanted dopant is performed and an oxide layer as the inter-insulating layer is coated thereon to a thickness of 6000 Å. Then, a window for forming an electrode is formed. Finally, aluminum is vacuum-evaporated to a thickness of 8000 Å and is etched to form a wiring pattern, thereby forming the device according to the present invention.

As described above, when the bias voltages $V_{gs}$ (gate to source) and V(drain to source) are applied to the completed device, $V_{gs}$ forms the channel on the active layer and $V_{ds}$ causes conduction. When $V_{gs}$ is applied in the forward direction, the device is turned-on normally, when reversely applied, the device is turned-off so that the current flowing through the device is zero, assuming an ideal device. In practice, however, since the device is not turned-off completely, a small amount of leakage current flows.

Figure 10:
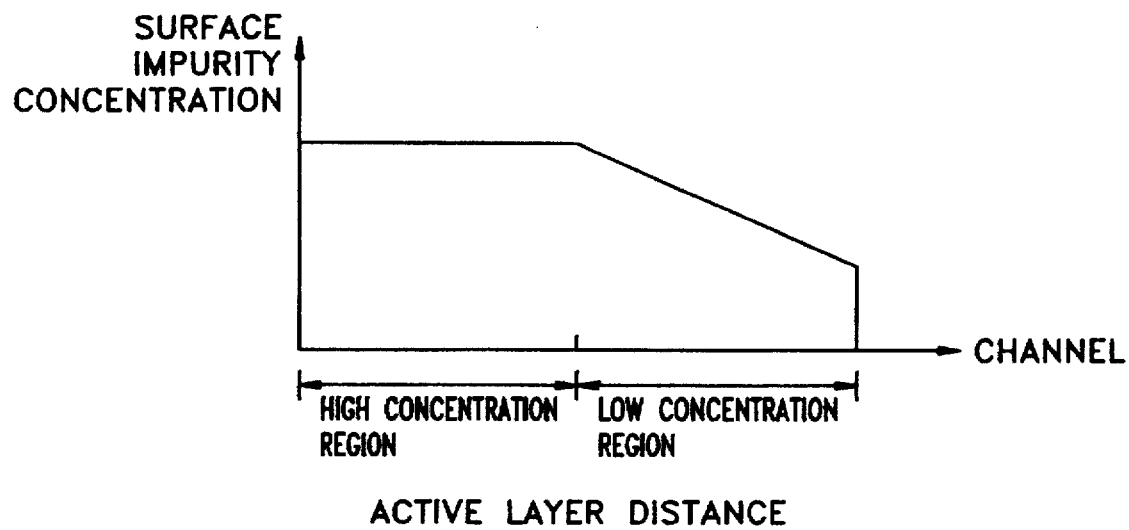
FIG. 10 is a graph showing the distribution of impurities in the high and low concentration portions of an LDD thin-film transistor according to the present invention.

As shown in FIG. 10, since the LDD polysilicon thin-film transistor of the present invention has the bird's beak type gate insulating layer, the impurity concentration tapers off toward the channel's direction. As a result, the threshold current is somewhat less and the leakage current is remarkably decreased, so that device performance is improved.

Figure 1:
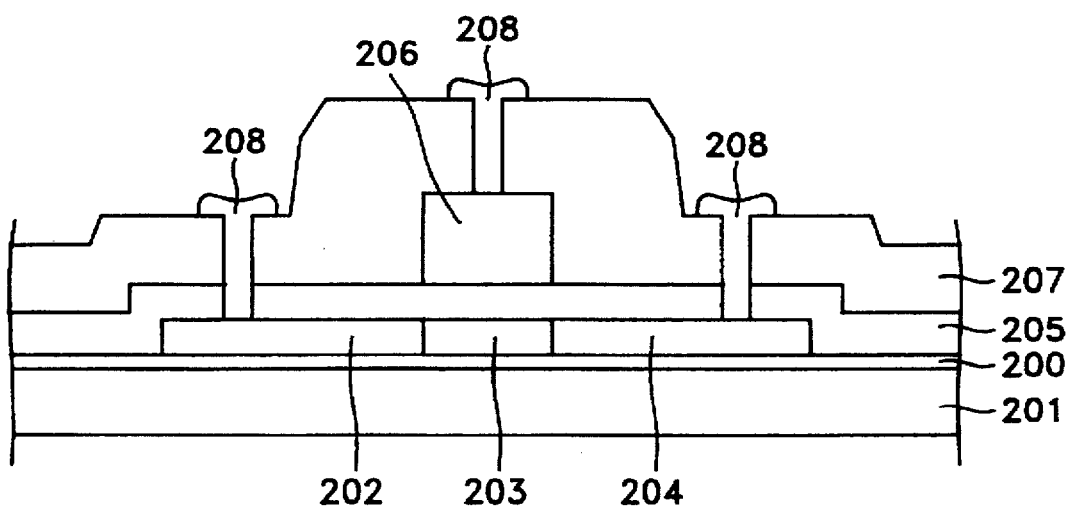
FIG. 1 is a section view of a conventional polysilicon thin-film transistor.
Figure 2:
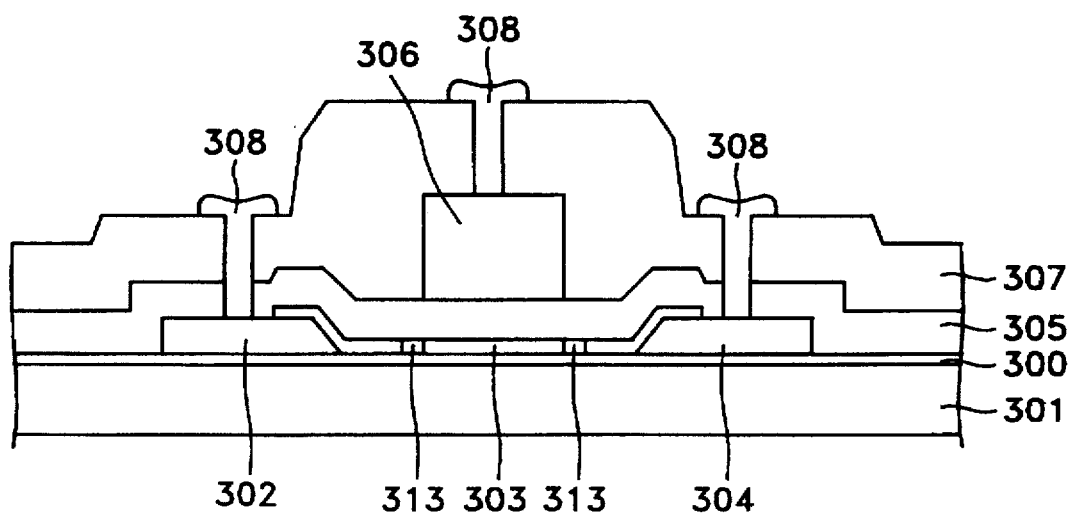
FIG. 2 is a section view of another conventional polysilicon thin-film transistor.
Figure 3:
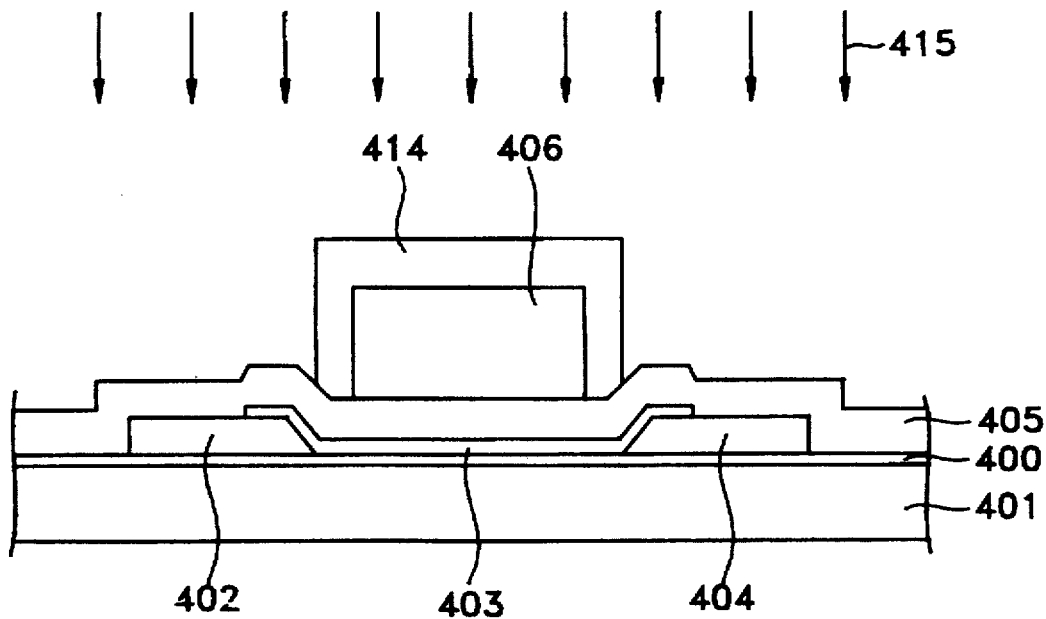
FIGS. 3 and 4 are section views showing the ion implantation process for forming an LDD-TFT on the polysilicon thin-film transistor shown in FIG. 2.
Figure 11:
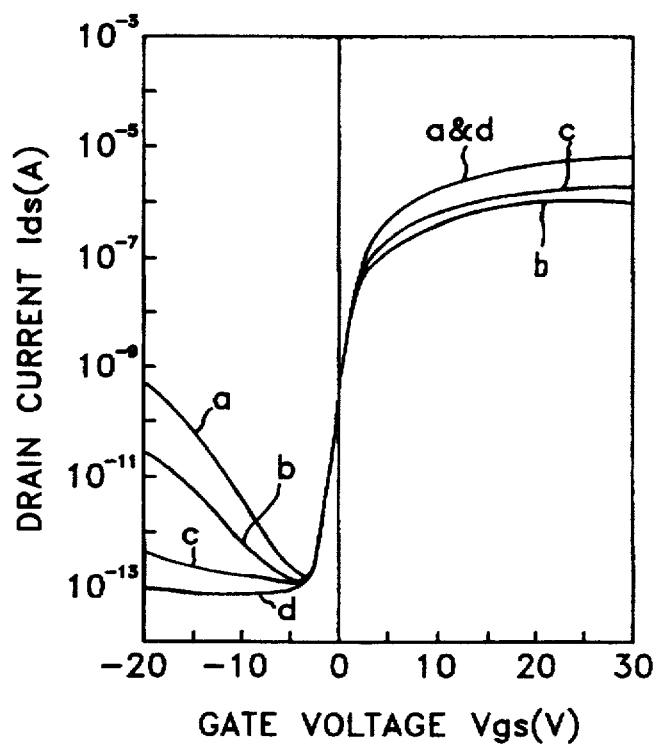
FIG. 11 shows the $V_{gs}$–$I_{ds}$ characteristics of various thin-film transistors.

FIG. 11 is a graph showing curves representing the drain current ($I_{ds}$) characteristic with respect to the gate voltage ($V_{gs}$) of the transistor of each case. In these $V_{gs}$–$I_{ds}$ characteristic curves, (a) corresponds to the device shown in FIG. 1, (b) corresponds to the device shown in FIG. 2, (c) represents the $V_{gs}$–$I_{ds}$ characteristic curve of the device according to the present invention, and (d) shows the curve of a nearly ideal device. Here, the characteristic curve (c) also corresponds to the case where the device shown in FIG. 2 adopts an LDD structure.

As described above, the LDD polysilicon thin-film transistor according to the present invention, forms the active layer in a single body, oxidizes the upper surface thereof, forms the gate insulating layer whose ends are in the shape of a bird's beak, and simultaneously forms the source and drain regions in high and low concentrations by performing one ion implantation process, so that the process is simplified and the quality of the active layer is improved. Also, the ion concentration tapers off from the drain and source in a high concentration to the channel, so that the $V_{gs}$–$I_{ds}$ characteristic is improved.

What is claimed is:

1. An LDD polysilicon thin-film transistor comprising:

a quartz substrate;

an active layer formed on said quartz substrate and composed of drain and source regions formed by implanting a high ion concentration into both edges of the active layer, two low concentration ion implantation regions adjacent to the source and drain, and a channel formed between the low concentration ion implantation regions;

a gate insulating layer, having a bird's beak structure, formed on the upper surface of said active layer, the bird's beak structure not covering the drain and source regions;

a gate formed on said gate insulating layer;

an inter-insulating layer for insulating said active layer, said gate insulating layer, and said gate; and an electrode penetrating said inter-insulating layer for conducting between said source, gate and drain, and external terminals, respectively.

2. An LDD polysilicon thin-film transistor as recited in claim 1, wherein the bird's beak structure of said gate insulating layer appears above the two low concentration ion implantation regions adjacent to the source and drain regions of said active layer.

3. A semiconductor device comprising:

a substrate;

an active layer formed on said substrate and composed of first and second regions, said active layer having a high ion concentration in portions of said active layer, two low concentration ion implantation regions respectively adjacent to the first and second regions, and a channel formed between the two low concentration ion implantation regions; and a gate insulating layer formed on the upper surface of said active layer, wherein said gate insulating layer has two tapered end portions adjacent to the first and second regions, but not covering the first and second regions.

4. The semiconductor device recited in claim 3 wherein at least one of the tapered end portions of the gate insulating layer has a bird's beak structure.

5. The semiconductor device recited in claim 4 wherein the bird's beak structure has its largest width closest to a center of said gate insulating layer and its smallest width at the end portions adjacent to the first and second regions.

6. The semiconductor device recited in claim 5 wherein the first and second regions of said active layer are source and drain regions of a thin-film transistor.

7. The semiconductor device recited in claim 6 further comprising:

a gate region formed on said gate insulating layer;

an inter-insulating layer for insulating said active layer, said gate insulating layer, and said gate; and a plurality of electrodes penetrating said inter-insulating layer for respective connection to the source, drain and gate regions;

wherein said active layer is made of polysilicon.

8. An LDD polysilicon thin-film transistor as recited in claim 1, wherein the bird's beak structure covers at least part of the two low concentration ion implantation regions.

9. A semiconductor device as recited in claim 3, wherein the tapered end portions cover at least part of the two low concentration ion implantation regions.

* * * * *